United States Patent
Umemoto et al.

(10) Patent No.: US 7,094,701 B2
(45) Date of Patent: Aug. 22, 2006

(54) MANUFACTURING METHOD OF SEMICONDUCTOR DEVICE

(75) Inventors: Mitsuo Umemoto, Osaka (JP); Masataka Hoshino, Kawasaki (JP); Hiroshi Terao, Tokyo (JP)

(73) Assignees: Sanyo Electric Co., Ltd., Osaka (JP); Fujitsu Limited, Kawasaki (JP); NEC Corporation, Tokyo (JP)

( * ) Notice: Subject to any disclaimer, the term of this patent is extended or adjusted under 35 U.S.C. 154(b) by 0 days.

(21) Appl. No.: 11/182,024

(22) Filed: Jul. 15, 2005

(65) Prior Publication Data
US 2006/0024966 A1 Feb. 2, 2006

(30) Foreign Application Priority Data
Jul. 16, 2004 (JP) ............... 2004-210188

(51) Int. Cl.
*H10L 22/302* (2006.01)
(52) U.S. Cl. .......... 438/706; 438/689; 438/700; 257/459
(58) Field of Classification Search ........ 438/689, 438/700, 706
See application file for complete search history.

(56) References Cited

U.S. PATENT DOCUMENTS 6,200,888 B1 *  3/2001  Ito et al. .............. 438/597

2003/0025173 A1 *  2/2003  Suminoe et al. ............ 257/459
2005/0248030 A1 * 11/2005  Ocihiai ....................... 257/734

FOREIGN PATENT DOCUMENTS

JP 2003-309221 10/2003

* cited by examiner

*Primary Examiner*—Nadine G. Norton
*Assistant Examiner*—Patricia George
(74) *Attorney, Agent, or Firm*—Morrison & Foerster LLP

(57) ABSTRACT

A manufacturing method of a semiconductor device having a through-hole electrode is offered to improve reliability and yield of the semiconductor device. A via hole penetrating through a semiconductor substrate is formed at a location corresponding to a pad electrode. An insulation film is formed on a back surface of the semiconductor substrate and a surface of the via hole. A reinforcing insulation film having an overhung portion at a rim of the via hole is formed on the back surface of the semiconductor substrate. The insulation film on a bottom of the via hole is removed by etching using the reinforcing insulation film as a mask, while the insulation film on a side wall of the via hole remains. The through-hole electrode, a wiring layer and a conductive terminal are formed on the back surface of the semiconductor substrate and the via hole. Finally, the semiconductor substrate is divided into a plurality of semiconductor dice by dicing.

12 Claims, 13 Drawing Sheets

MANUFACTURING METHOD OF SEMICONDUCTOR DEVICE

CROSS-REFERENCE OF THE INVENTION

This invention is based on Japanese Patent Application No. 2004-210188, the content of which is incorporated herein by reference in its entirety.

BACKGROUND OF THE INVENTION

1. Field of the Invention

This invention relates to a manufacturing method of a semiconductor device, specifically to a manufacturing method of a semiconductor device having a through-hole electrode.

2. Description of the Related Art

A CSP (Chip Size Package) has received attention in recent years as a three-dimensional mounting technology as well as a new packaging technology. The CSP means a small package having about the same outside dimensions as those of a semiconductor die packaged in it.

A BGA type semiconductor device with a through-hole electrode has been known as a kind of CSP. This BGA type semiconductor device has a through-hole electrode that penetrates through a semiconductor substrate and is connected with a pad electrode. And a plurality of ball-shaped conductive terminals made of metal such as solder is arrayed in a grid pattern on a back surface of the semiconductor device.

When the semiconductor device is incorporated into electronic equipment, each of the conductive terminals is connected to a wiring pattern on a circuit board such as a printed circuit board.

Such a BGA type semiconductor device has advantages in providing a large number of conductive terminals and in reducing size over other CSP type semiconductor devices such as an SOP (Small Outline Package) and a QFP (Quad Flat Package) that have lead pins protruding from their sides.

Next, a conventional manufacturing method of the BGA type semiconductor device with the though-hole electrode will be described referring to the drawings. FIGS. 24 and 25 are cross-sectional views showing such a conventional manufacturing method of the semiconductor device.

First, a semiconductor substrate 70 having a pad electrode 71 formed on its top surface through an interlayer insulation film 72, that is a first insulation layer, is provided as shown in FIG. 24. Next, a supporting body 73 is bonded to the top surface of the semiconductor substrate 70 through a resin layer 74, when necessary. Then a mask pattern (not shown) is formed on a back surface of the semiconductor substrate 70 and the semiconductor substrate 70 is etched to form a via hole 76 that is cut through the semiconductor substrate 70 from a position of the back surface corresponding to the pad electrode 71 to the top surface. A portion of the interlayer insulation film 72 exposed on a bottom of the via hole 76 is removed by etching. Next, an insulation film 77, that is a second insulation film, is formed on the back surface of the semiconductor substrate 70 and on a surface of the via hole 76.

And the insulation film 77 on the bottom of the via hole 76 is etched off by reactive ion etching to expose the pad electrode 71, as shown in FIG. 25. Then a through-hole electrode (not shown) that is connected with the pad electrode 71 is formed in the via hole 76. And a wiring layer (not shown) connected with the through-hole electrode is formed on the back surface of the semiconductor substrate 70. Furthermore, a protection layer (not shown) is formed over the back surface of the semiconductor substrate 70 and the wiring layer. Then a portion of the protection layer is removed to expose a portion of the wiring layer, and a conductive terminal (not shown) is formed on the portion of the wiring layer. After that, the semiconductor substrate 70 is separated into a plurality of semiconductor dice by dicing.

When the insulation film 77 is formed by CVD (Chemical Vapor Deposition) in the above-described manufacturing method of the semiconductor device, a supply of a gas of film-forming materials is insufficient at the bottom of the via hole 76. Therefore, the insulation film 77 at the bottom of the via hole 76 is formed to have a thickness thinner than that of the insulation film 77 on the back surface of the semiconductor substrate 70.

Thus, taking advantage of the difference in the film thicknesses described above, the insulation film 77 at the bottom of the via hole 76 is removed by etching without using a mask in the process step to expose the pad electrode 71 by reactive ion etching of the insulation film 77 on the bottom of the via hole 76. The insulation film 77 at the bottom of the via hole 76 is etched off to expose the pad electrode 71 before the insulation film 77 on the back surface of the semiconductor substrate 70 is etched off. The etching described above must be controlled so that the pad electrode 71 is exposed while the insulation film 77 is left on a side wall of the via hole 76.

Further description on the technologies mentioned above is disclosed in Japanese Patent Application Publication No. 2003-309221, for example.

In the etching process of the insulation film 77 at the bottom of the via hole 76 by the reactive ion etching, however, electric field is converged on the insulation film 77 at corners 70a and 70b of the via hole 76 in the semiconductor substrate 70 as shown in FIG. 25, making concentration of the reactive ions there higher than at other locations. As a result, there is a possibility that the etching of the insulation film 77 is accelerated at the corners 70a and 70b to make the film thickness extremely thin or remove the insulation film 77 completely.

Also, there is a tendency that the insulation film 77 formed on the side wall of the via hole 76 other than at the corners 70a and 70b is removed by the etching to reduce the thickness. Therefore, when the through-hole electrode (not shown) is formed in the via hole 76 after the etching, insulation failure is caused between the through-hole electrode and the semiconductor substrate 70 in some cases. As a result, reliability and yield of the semiconductor device have been reduced.

SUMMARY OF THE INVENTION

The invention provides a method of manufacturing a semiconductor device. The method includes providing a semiconductor substrate having a first insulation film formed on the top surface thereof and a pad electrode formed on the first insulation film, forming from the bottom surface of the semiconductor substrate a via hole penetrating through the semiconductor substrate to expose part of the first insulation film that covers the pad electrode, removing the exposed part of the first insulation film, forming a second insulation film on the bottom surface of the semiconductor substrate and inside the via hole, forming a third insulation film on the second insulation film so that the third insulation film includes an overhung portion extending from a rim of the via hole toward an inside of the via hole, etching the second insulation film using the third insulation film as a mask to expose the pad electrode at a bottom of the via hole, forming in the via hole a through-hole electrode in the via hole that is electrically connected with the pad electrode, and cutting the semiconductor substrate to produce a semiconductor die.

The invention also provides another method of manufacturing a semiconductor device. The method includes providing a semiconductor substrate having a first insulation film formed on the top surface thereof and a pad electrode formed on the first insulation film, forming on the bottom surface of the semiconductor substrate a hard mask having an opening corresponding to the pad electrode on the top surface, and forming using the hard mask as an etching mask a via hole that has an undercut around the opening so that a top portion of the via hole is larger than a bottom portion of the via hole. Part of the first insulation film that covers the pad electrode is exposed in the via hole. The method also includes removing the exposed part of the first insulation film, forming a second insulation film on the hard mask and inside the via hole so that the second insulation film has an overhung portion extending from a rim of the via hole toward an inside of the via hole, etching the second insulation film using the overhanging portion of the second insulation film as a mask to expose the pad electrode at a bottom of the via hole, forming in the via hole a through-hole electrode that is electrically connected with the pad electrode, and cutting the semiconductor substrate to produce a semiconductor die.

The invention further provides other method of manufacturing a semiconductor device. The method includes providing a semiconductor substrate comprising a first insulation film formed on the top surface thereof and a pad electrode formed on the first insulation film, forming from the bottom surface of the semiconductor substrate a via hole penetrating through the semiconductor substrate to expose part of the first insulation film that covers the pad electrode, removing the exposed part of the first insulation film, forming a second insulation film on the bottom surface of the semiconductor substrate and inside the via hole, forming a metal mask made of a metal on the second insulation film so that an opening of the metal mask corresponds to the via hole, etching the second insulation film using the metal mask to expose the pad electrode at a bottom of the via hole, removing the metal mask, forming in the via hole a through-hole electrode that is electrically connected with the pad electrode, and cutting the semiconductor substrate to produce a semiconductor die.

DETAILED DESCRIPTION OF THE INVENTION

Figure 1:
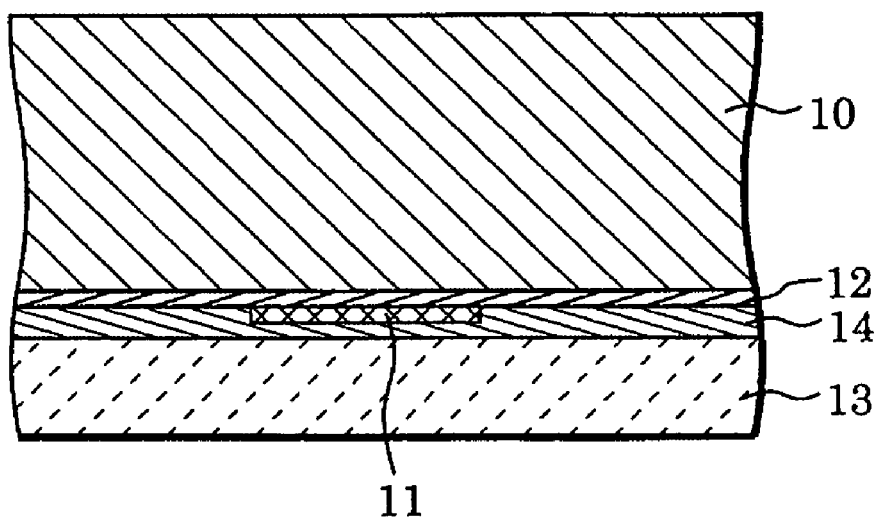
FIG. 1 is a cross-sectional view showing a manufacturing method of a semiconductor device according to a first embodiment of this invention.

Next, a manufacturing method of a semiconductor device according to a first embodiment of this invention will be explained hereinafter, referring to the drawings. FIGS. 1–9 are cross-sectional views showing the manufacturing method of the semiconductor device according to the first embodiment. Note that FIGS. 1–9 show a region of a semiconductor substrate around a dicing line (not shown).

First, the semiconductor substrate 10 on which an electronic device (not shown) is formed is provided, as shown in FIG. 1. The electronic device (not shown) is a light receiving device such as a CCD (Charge Coupled Device) and an infrared sensor or a light emitting device. Or the electronic device (not shown) may be an electronic device other than the light receiving device or light emitting device mentioned above.

A pad electrode 11, that is connected with the electronic device (not shown) and makes an electrode for external connection, is formed on a top surface of the semiconductor substrate 10. The pad electrode 11 is formed on the top surface of the semiconductor substrate 10 through an interlayer insulation film 12 that is a first insulation film.

The semiconductor substrate 10 is made of silicon, for example, and has a film thickness of 130 µm preferably. The pad electrode 11 is made of aluminum, for example, and has a film thickness of 1 µm preferably. The interlayer insulation film 12 is made of BPSG (Boro-Phospho-Silicate Glass), for example, and has a film thickness of 0.8 µm preferably.

Also, a supporting body 13 may be formed on the top surface of the semiconductor substrate 10, when necessary. The supporting body 13 is formed on the top surface of the semiconductor substrate 10 through a resin layer 14. The supporting body 13 is made of a transparent or semitransparent material such as a glass when the electronic device (not shown) is a light receiving device or a light emitting device. The supporting body 13 may be made of material other than the transparent or semitransparent material when the electronic device (not shown) is not a light receiving device or a light emitting device. The supporting body 13 may be in a form of a tape. The supporting body 13 may be removed in a later process step. Or, the supporting body 13 may remain without being removed.

Figure 2:
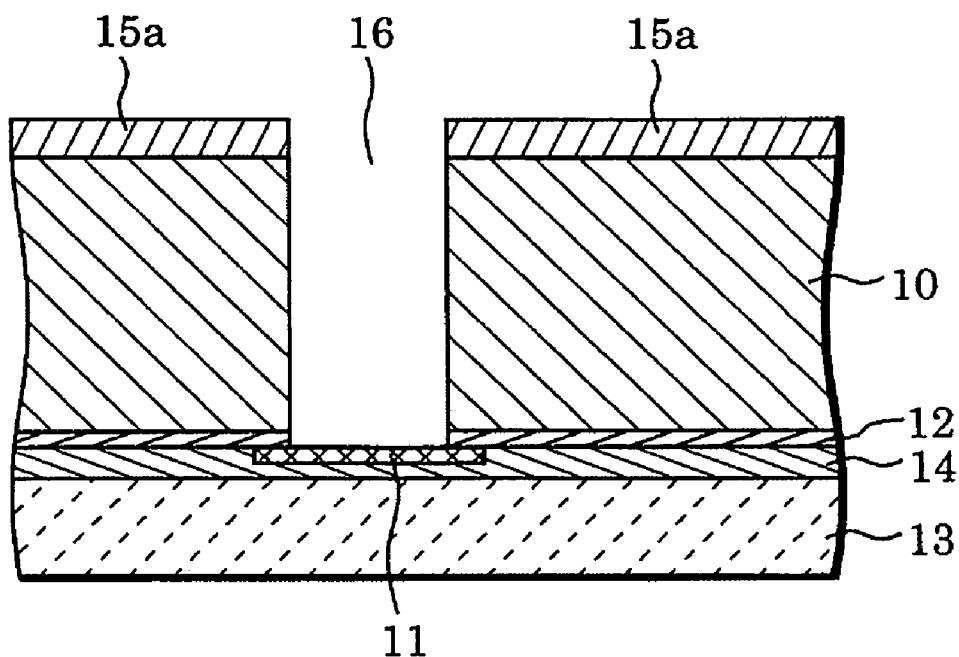
FIG. 2 is a cross-sectional view showing the manufacturing method of the semiconductor device according to the first embodiment of this invention.

Next, a first photoresist layer 15a is selectively formed on a back surface of the semiconductor substrate 10, as shown in FIG. 2. The first photoresist layer 15a has an opening at a location on the back surface of the semiconductor substrate 10 corresponding to the pad electrode 11. Next, the semiconductor substrate 10 is etched preferably by dry etching using the first photoresist layer 15a as a mask. The etching forms a via hole 16 that penetrates through the semiconductor substrate 10 from the back surface to the top surface at the location corresponding to the pad electrode 11. The interlayer insulation film 12 is exposed at a bottom of the via hole 16, with the pad electrode 11 being attached under the exposed portion of the interlayer insulation film 12. Then the interlayer insulation film 12 exposed at the bottom of the vie hole 16 is etched to reduce its thickness or remove it completely by dry etching or wet etching, using the first photoresist layer 15a as a mask. Or the etching of the interlayer insulation film 12 may not be performed at this stage of the manufacturing process and may be performed in a later process step of etching to be described later.

Figure 3:
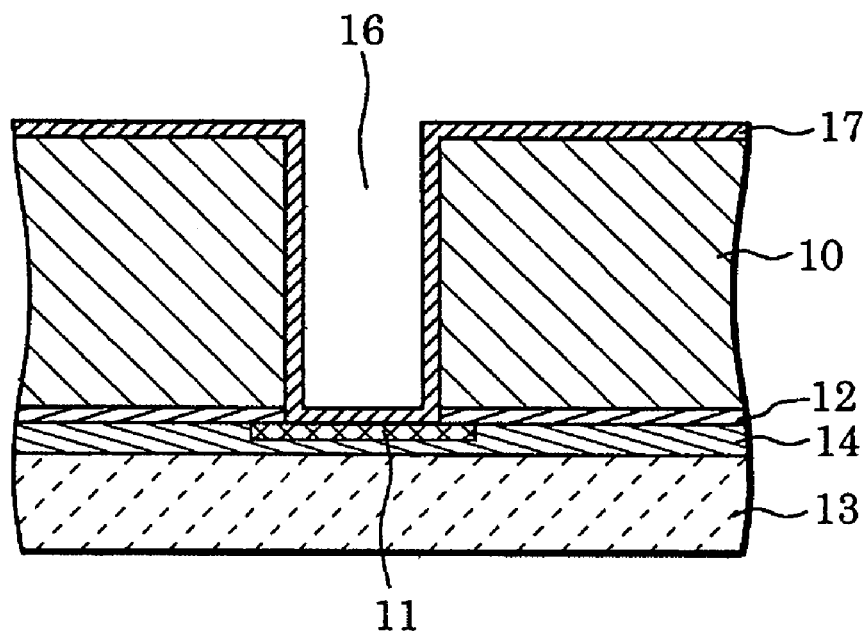
FIG. 3 is a cross-sectional view showing the manufacturing method of the semiconductor device according to the first embodiment of this invention.

After the first photoresist layer 15a is removed, an insulation film 17, that is a second insulation film, is formed on the back surface of the semiconductor substrate 10 and on a surface of the via hole 16, as shown in FIG. 3. The insulation film 17 is made of a silicon dioxide ($SiO_2$) film or a silicon nitride (SiN) film, for example, and is formed by plasma CVD, for example. The plasma CVD is performed preferably under conformal film-forming conditions, that is, conditions under which the insulation film 17 is formed to have nearly uniform thickness over a certain surface. The thickness is preferably 1 µm to 2 µm. One example of the conformal film-forming conditions is forming a film in a low pressure reaction chamber over a long period of time without supplying excess amount of plasma gas of film-forming materials in the via hole 16.

However, the thickness of the insulation film 17 formed on the bottom of the via hole 16 is thinner than the thickness of the insulation film 17 formed on the back surface of the semiconductor substrate 10. The difference in the thickness is caused because it is more difficult for the film-forming materials to reach the bottom of the via hole 16 than the back surface of the semiconductor substrate 10.

Figure 4:
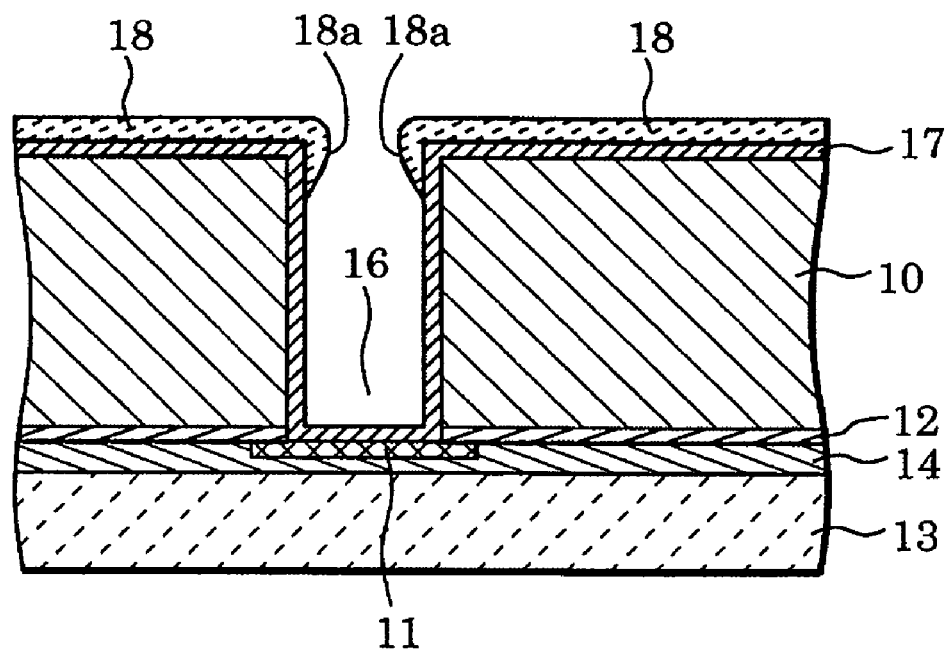
FIG. 4 is a cross-sectional view showing the manufacturing method of the semiconductor device according to the first embodiment of this invention.

Next, a reinforcing insulation film 18, that is a third insulation film, is formed on the insulation film 17, as shown in FIG. 4. A thickness of the reinforcing insulation film 18 is 1 µm to 2 µm preferably. The reinforcing insulation film 18 is formed to have an overhung portion 18a protruding from a rim of the via hole 16 on the back surface of the semiconductor substrate 10 toward inside of the via hole 16.

The reinforcing insulation film 18 is made of a silicon dioxide ($SiO_2$) film or a silicon nitride (SiN) film, for example, and is formed by plasma CVD, for example. The plasma CVD has non-conformal film-forming conditions, that is, conditions under which the reinforcing insulation film 18 is not formed to have nearly uniform thickness over a certain surface. One example of the non-conformal film-forming conditions is supplying excess amount of plasma gas of film-forming materials in the via hole 16 and applying a low voltage. The plasma CVD under the non-conformal film-forming conditions can grow the film in a shorter period of time compared with the plasma CVD under the conformal film-forming conditions used in growing the insulation film 17.

And the plasma CVD under the non-conformal film-forming conditions is lower in production cost compared with the plasma CVD under the conformal film-forming conditions. As a result, suppressing the production cost of forming the reinforcing insulation film 18 with the overhung portion 18a is made possible.

Figure 5:
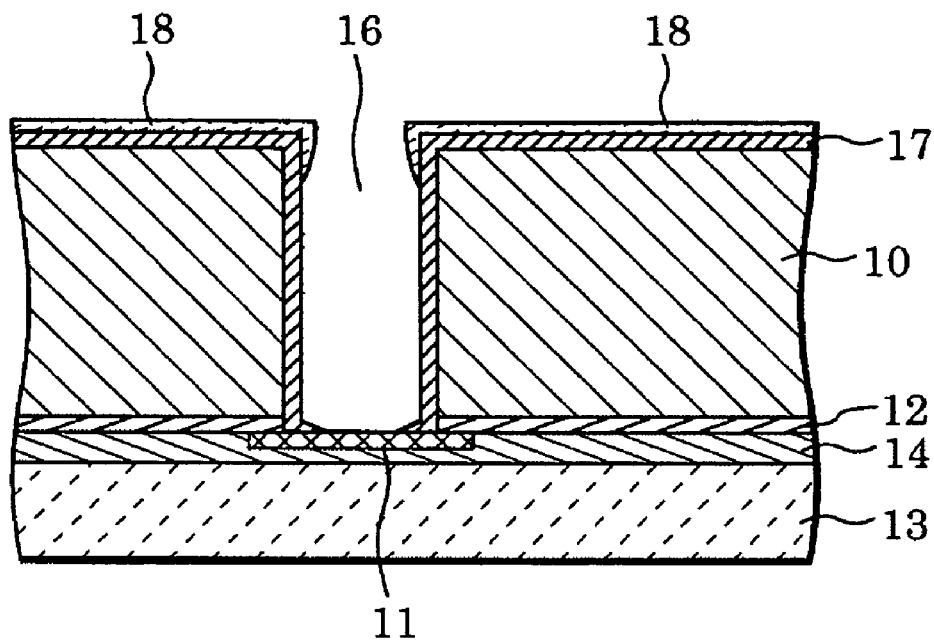
FIG. 5 is a cross-sectional view showing the manufacturing method of the semiconductor device according to the first embodiment of this invention.

Next, the insulation film 17 (and the interlayer insulation film 12, if it remains) on the bottom of the via hole 16 is removed by etching using the reinforcing insulation film 18 as a mask, as shown in FIG. 5. Although the etching is preferably reactive ion etching, it may be other etching method.

The aperture of the opening in the reinforcing insulation film 18 around the via hole 16 is made smaller than the aperture of the via hole 16 because of the overhung portion 18a of the reinforcing insulation film 18. Since the overhung portion 18a suppresses a flow of etching gas reaching a side wall of the via hole 16, an etched-off region of the insulation film 17 does not extend to the side wall of the via hole 16 while the insulation film 17 (or the insulation film 17 and the interlayer insulation film 12) at the bottom of the via hole 16 is etched off. And the reduction in the thickness of the insulation film 17 on the side wall of the via hole 16 by the etching is suppressed as much as possible.

By the etching described above, the insulation film 17 at the bottom of the via hole 16 can be removed to expose the pad electrode 11 while the insulation film 17 formed on the side wall of the via hole 16 remains.

Figure 6:
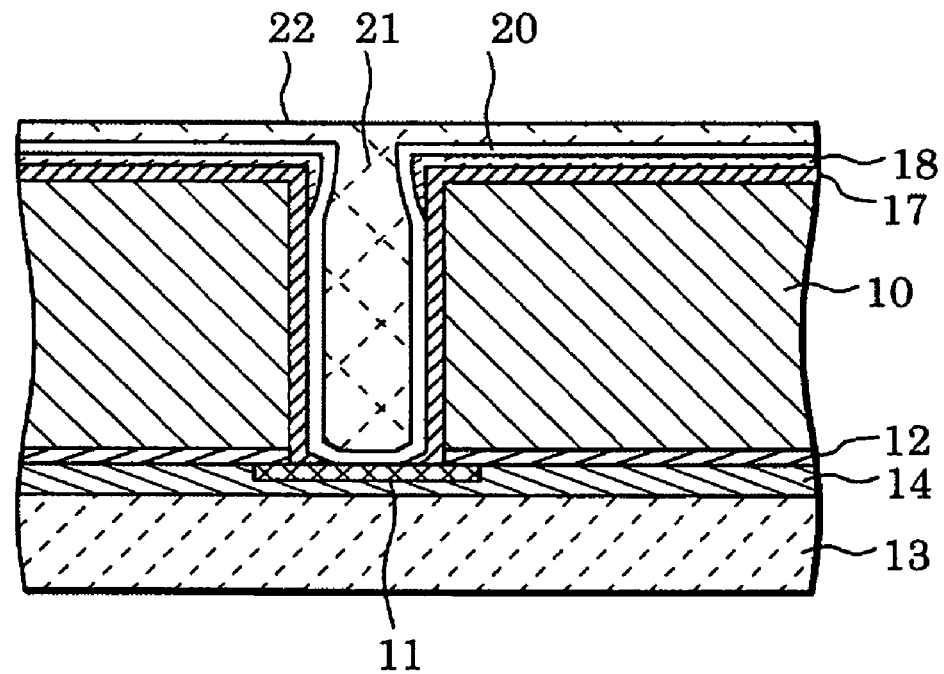
FIG. 6 is a cross-sectional view showing the manufacturing method of the semiconductor device according to the first embodiment of this invention.

Next, a barrier/seed layer 20 is formed on the insulation film 17 and the reinforcing insulation film 18 on the back surface of the semiconductor substrate 10 and on the surface of the via hole 16, as shown in FIG. 6. The barrier/seed layer 20 has a structure of stacked layers made of a barrier metal layer and a seed layer (not shown). The barrier metal layer is made of a metal such as a titanium-tungsten (TiW) layer, a titanium nitride (TiN) layer or a tantalum nitride (TaN) layer, for example. The seed layer is to serve as an electrode for plating to form a wiring layer 22 as will be described below, and is made of a metal such as copper (Cu), for example.

The barrier/seed layer 20 is formed by sputtering, CVD, electroless plating or other film-forming method, for example.

When the insulation film 17 on the side wall of the via hole 16 or the reinforcing insulation film 18 is made of silicon nitride (SiN) film, the barrier/seed layer 20 may have a single layer structure composed of the seed layer made of copper (Cu), since the silicon nitride (SiN) film serves as a barrier against diffusion of copper.

Figure 7:
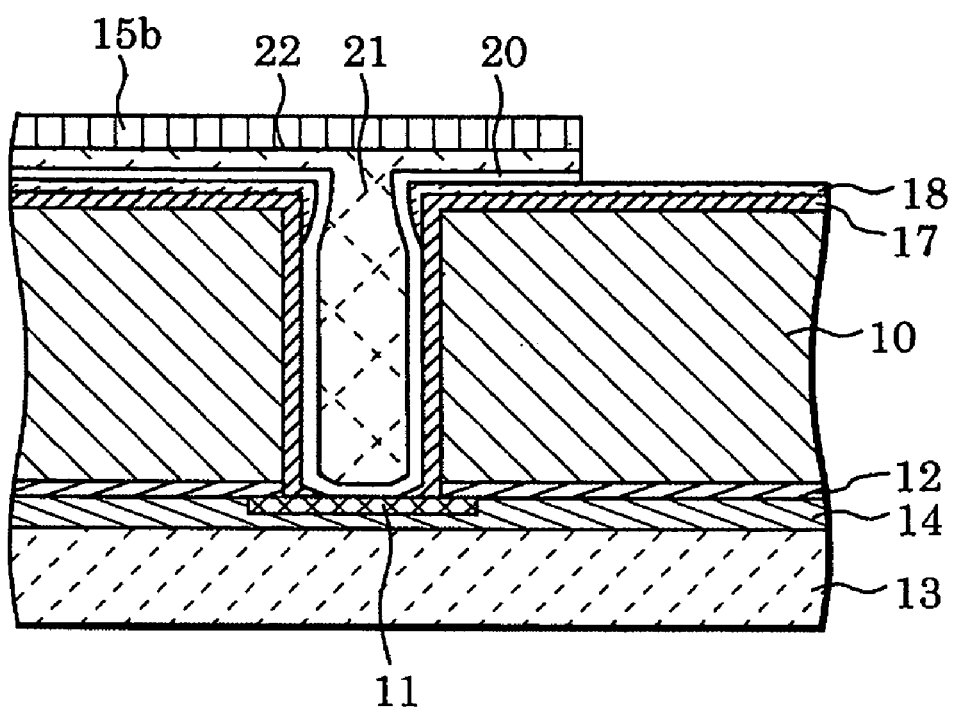
FIG. 7 is a cross-sectional view showing the manufacturing method of the semiconductor device according to the first embodiment of this invention.
Figure 25:
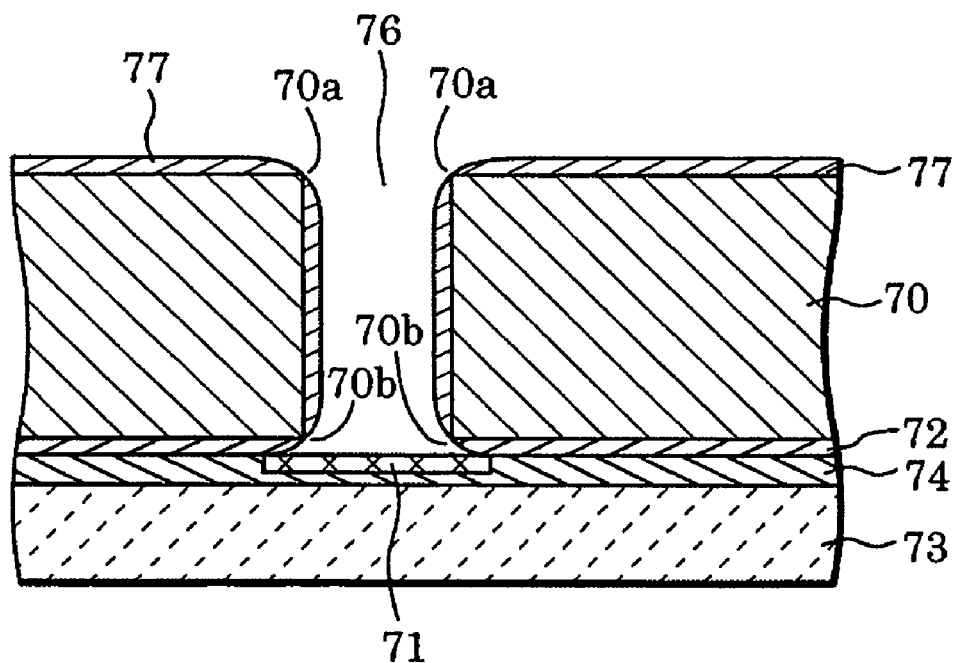
FIG. 25 is a cross-sectional view showing the manufacturing method of the semiconductor device according to the conventional art.

Next, a through-hole electrode 21 made of copper (Cu), for example, and the wiring layer 22, that is continuous to the through-hole electrode 21, are formed on the barrier/seed layer 20, including inside of the via hole 16, by electrolytic plating, for example. The thickness of the plating is adjusted so that the through-hole electrode 21 fills the via hole 16 completely or incompletely. The through-hole electrode 21 and the wiring layer 22 are electrically connected to the pad electrode 11 exposed at the bottom of the via hole 16 through the barrier/seed layer 20. Since the side wall of the via hole 16 is covered with the insulation film 17 and the reinforcing insulation film 18, the conventional insulation failure between the through-hole electrode in the via hole and the semiconductor substrate, as is the case with the device of FIG. 25, is prevented Next, a second photoresist layer 15b, that is used to shape the wiring layer 22 into a predetermined pattern, is formed selectively on the wiring layer 22 on the back surface of the semiconductor substrate 10, as shown in FIG. 7. The second photoresist layer 15b is formed on a region of the wiring layer 22 that is to remain corresponding to the predetermined pattern. The region of the wiring layer 22 that is to remain includes a location of the via hole 16 at least.

Next, unnecessary portion of the wiring layer 22 and the barrier/seed layer 20 are removed by etching using the second photoresist layer 15b as a mask. Or, at least the unnecessary portion of the wiring layer 22 is removed by etching. The wiring layer 22 is shaped into the predetermined pattern of wiring by the etching.

Figure 8:
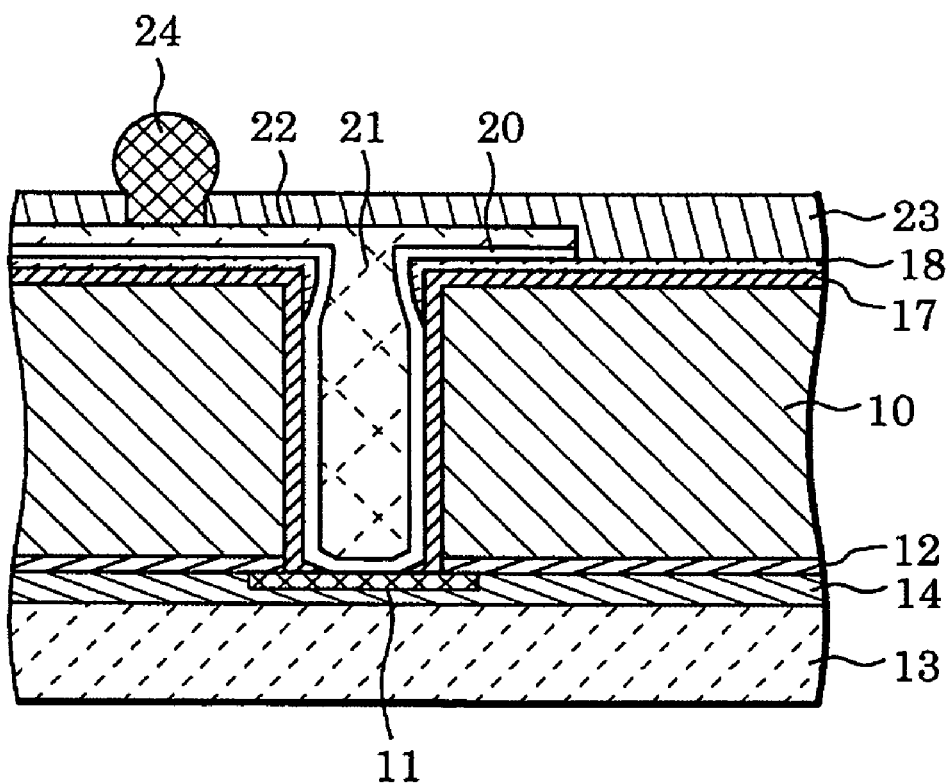
FIG. 8 is a cross-sectional view showing the manufacturing method of the semiconductor device according to the first embodiment of this invention.

Next, after the second photoresist layer 15b is removed, a protection layer 23 made of a photoresist material, for example, is formed to cover the back surface of the semiconductor substrate 10, as shown in FIG. 8. An opening is formed in the protection layer 23 at a location on the wiring layer 22. And a ball-shaped conductive terminal 24 made of a metal such as solder is formed on the wiring layer 22 exposed in the opening.

Figure 9:
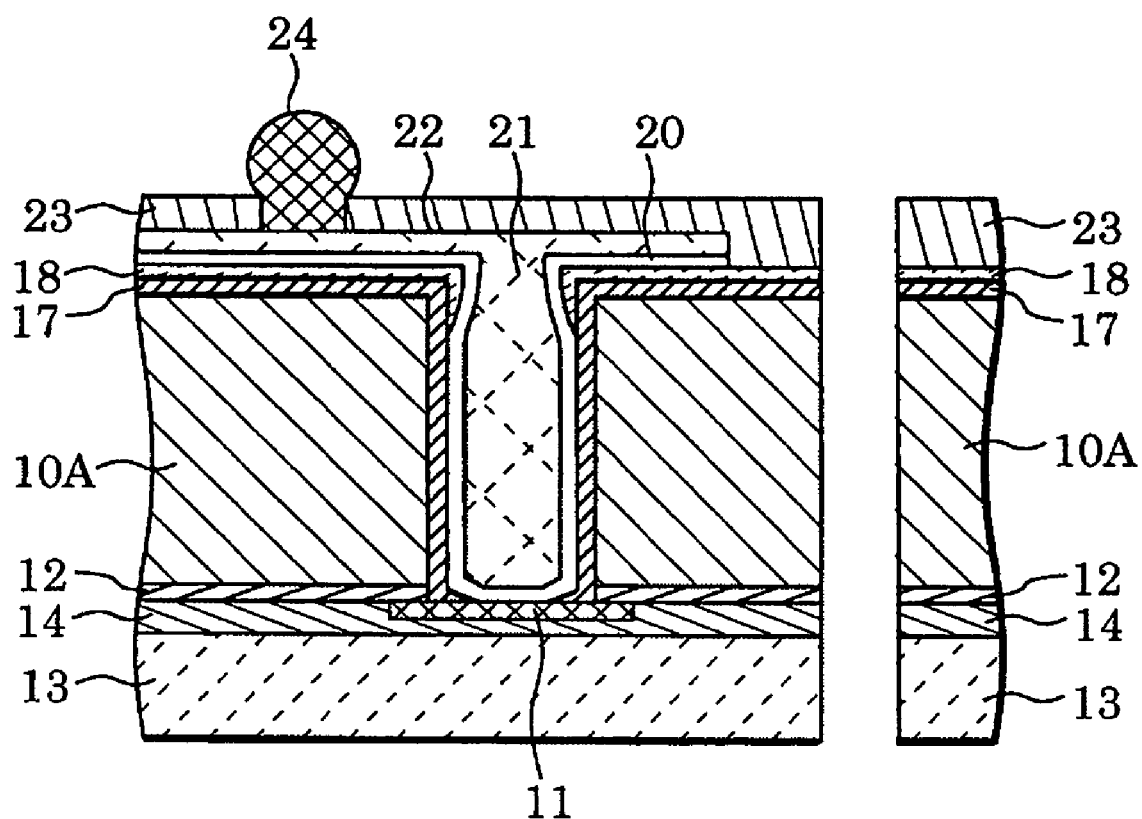
FIG. 9 is a cross-sectional view showing the manufacturing method of the semiconductor device according to the first embodiment of this invention.

Next, the semiconductor substrate 10 and the stacked layers on it are diced and separated along a dicing line (not shown), as shown in FIG. 9. With this, a plurality of semiconductor devices composed of semiconductor dice 10A and the stacked layers is completed.

As described above, the overhung portion 18a of the reinforcing insulation film 18 suppresses the flow of etching gas reaching the side wall of the via hole 16 when the insulation film 17 (and the interlayer insulation film 12, if it remains) at the bottom of the via hole 16 is etched, in the manufacturing method according to the first embodiment. Consequently, the etched-off region of the insulation film 17 at the bottom of the via hole 16 can be kept from extending to the side wall of the via hole 16. And the reduction in the thickness of the insulation film 17 on the side wall of the via hole 16 by the etching is suppressed as much as possible. That is, it is made possible that the pad electrode 11 is exposed while insulation is maintained between the through-hole electrode 21 in the via hole 16 and the semiconductor substrate 10.

Therefore, the insulation failure between the through-hole electrode and the semiconductor die observed with the device of FIG. 25 is prevented. As a result, in the manufacturing method of the semiconductor device having the through-hole electrode, the reliability and yield of the semiconductor device can be improved.

Next, a manufacturing method of a semiconductor device according to a second embodiment of this invention will be explained hereinafter, referring to the drawings. FIGS. 10–17 are cross-sectional views showing the manufacturing method of the semiconductor device according to the second embodiment. The same reference numerals are used for the common components in FIGS. 10–17 as in FIGS. 1–9 referred in the explanation of the first embodiment.

Figure 10:
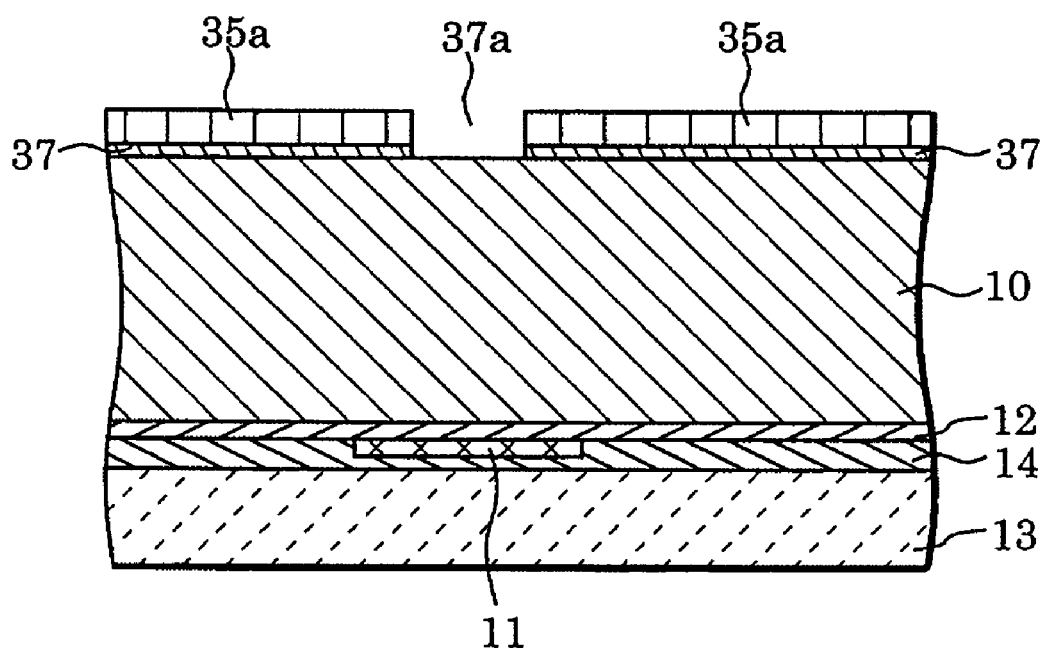
FIG. 10 is a cross-sectional view showing a manufacturing method of a semiconductor device according to a second embodiment of this invention.

First, a semiconductor substrate 10 on which an electronic device (not shown) is formed is provided, as shown in FIG. 10. A pad electrode 11, that is connected with the electronic device (not shown), is formed on a top surface of the semiconductor substrate 10. The pad electrode 11 is formed on the top surface of the semiconductor substrate 10 through an interlayer insulation film 12 that is a first insulation film. Also, a supporting body 13 may be formed on the top surface of the semiconductor substrate 10, when necessary. The supporting body 13 is formed on the top surface of the semiconductor substrate 10 through a resin layer 14.

Next, a hard mask 37 is formed on a back surface of the semiconductor substrate 10. The hard mask 37 is made of a hard film such as a silicon dioxide ($SiO_2$) film or a silicon nitride (SiN) film, for example, and is formed by CVD, for example. Or, the hard mask 37 may be made of a hard material other than the silicon dioxide ($SiO_2$) film or the silicon nitride (SiN) film, and may be formed by a method other than CVD.

Next, a first photoresist layer 35a is selectively formed on the hard mask 37 to have an opening at a location corresponding to the pad electrode 11. And the hard mask 37 is selectively etched and removed using the first photoresist layer 35a as a mask. The etching forms an opening 37a in the hard mask 37 at the location corresponding to the pad electrode 11.

Figure 11:
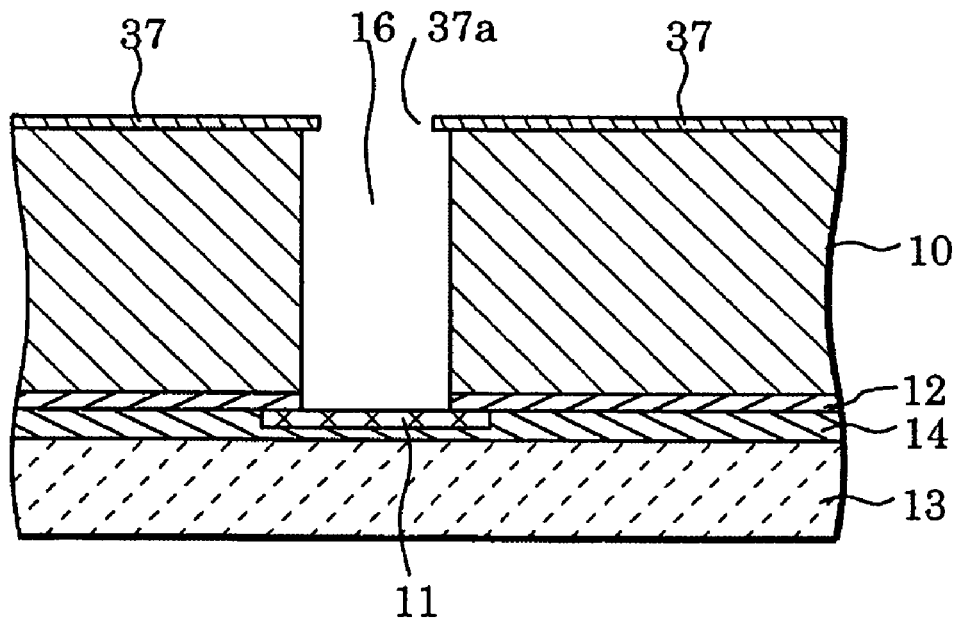
FIG. 11 is a cross-sectional view showing the manufacturing method of the semiconductor device according to the second embodiment of this invention.

Next, after the first photoresist layer 35a is removed, the semiconductor substrate 10 is etched preferably by dry etching using the hard mask 37 as a mask, as shown in FIG. 11. The etching forms a via hole 16 that penetrates through the semiconductor substrate 10 from the back surface to the top surface. The via hole 16 is formed to have an opening portion 37a that is the opening of the hard mask 37 and narrower than the hole size inside the via hole 16. That is, a rim of the opening 37a protrudes toward inside of the via hole 16.

That is because an electric field converges at the rim of the opening 37a of the hard mask 37 on the back surface of the semiconductor substrate 10 during the etching, and the etching proceeds on an underlying portion of the opening 37a of the hard mask 37.

Then the interlayer insulation film 12 exposed at the bottom of the vie hole 16 is etched to reduce its thickness or remove it completely by dry etching or wet etching, using the hard mask 37 as a mask. Or, the etching of the interlayer insulation film 12 may not be performed at this stage of the manufacturing process and may be performed in a later process step of etching to be described later.

Figure 12:
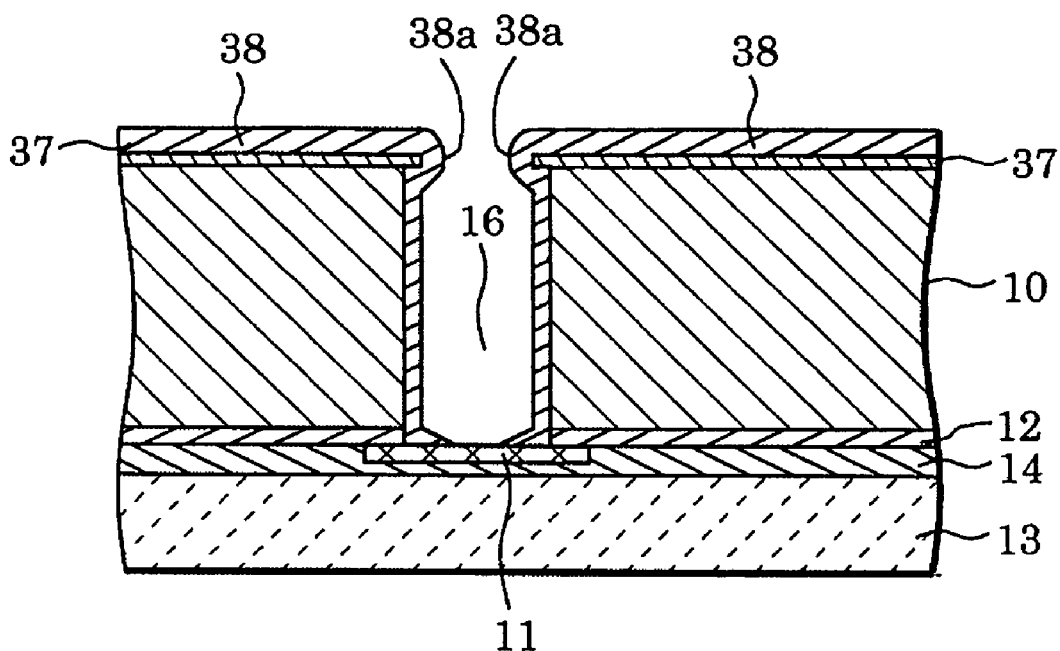
FIG. 12 is a cross-sectional view showing the manufacturing method of the semiconductor device according to the second embodiment of this invention.

Next, an insulation film 38, that is a second insulation film, is formed on a surface of the via hole 16 and on the hard mask 37 on the back surface of the semiconductor substrate 10, as shown in FIG. 12. The insulation film 38 is formed to have an overhung portion 38a protruding from a rim of the via hole 16 on the back surface of the semiconductor substrate 10 toward inside of the via hole 16.

The insulation film 38 is made of a silicon dioxide ($SiO_2$) film or a silicon nitride (SiN) film, for example, and is formed by plasma CVD, for example. Or, the insulation film 38 may be formed by a method other than the plasma CVD.

A thickness of the insulation film 38 formed at the bottom of the via hole 16 is thinner than a thickness of the insulation film 38 formed on the hard mask 37 on the back surface of the semiconductor substrate 10. The difference in the thickness is caused because it is more difficult for the film-forming materials to reach the bottom of the via hole 16 than the back surface of the semiconductor substrate 10.

Figure 13:
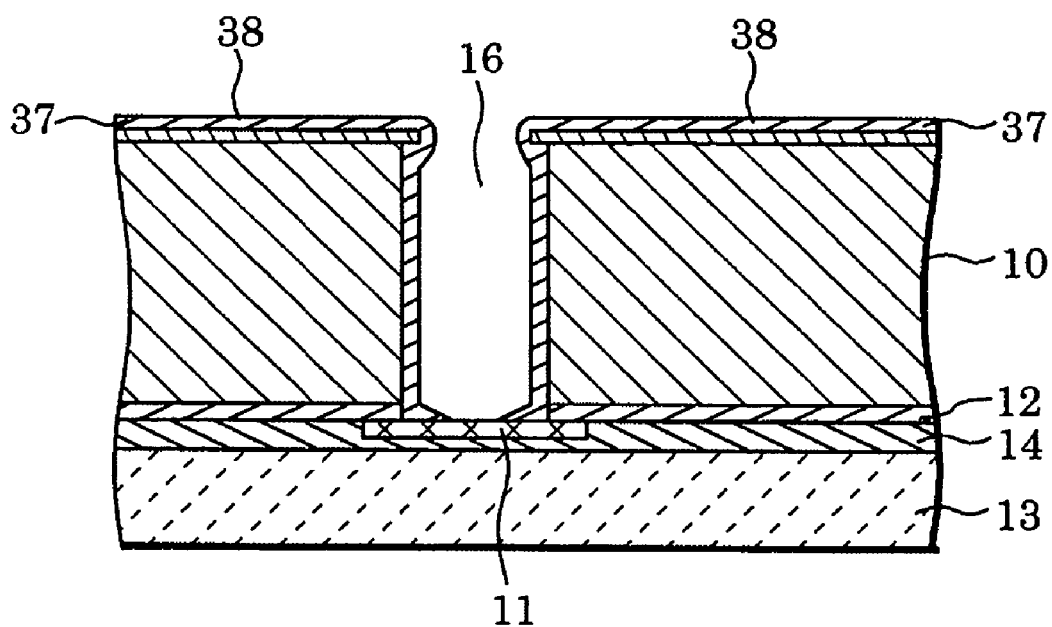
FIG. 13 is a cross-sectional view showing the manufacturing method of the semiconductor device according to the second embodiment of this invention.

Next, the insulation film 38 (and the interlayer insulation film 12, if it remains) on the bottom of the via hole 16 is removed by etching using the insulation film 38 as a mask, as shown in FIG. 13. Although the etching is preferably reactive ion etching, it may be other etching method.

The aperture of the opening in the insulation film 38 around the via hole 16 is made smaller than the aperture of the via hole 16 because of the overhung portion 38a of the insulation film 38. Since the overhung portion 38a suppresses a flow of etching gas reaching a side wall of the via hole 16, an etched-off region of the insulation film 38 does not extend to the side wall of the via hole 16 while the insulation film 38 (or the insulation film 38 and the interlayer insulation film 12) at the bottom of the via hole 16 is etched off. And the reduction in the thickness of the insulation film 38 on the side wall of the via hole 16 by the etching is suppressed as much as possible.

By the etching described above, the insulation film 38 at the bottom of the via hole 16 can be removed to expose the pad electrode 11 while the insulation film 38 formed on the side wall of the via hole 16 remains.

Figure 14:
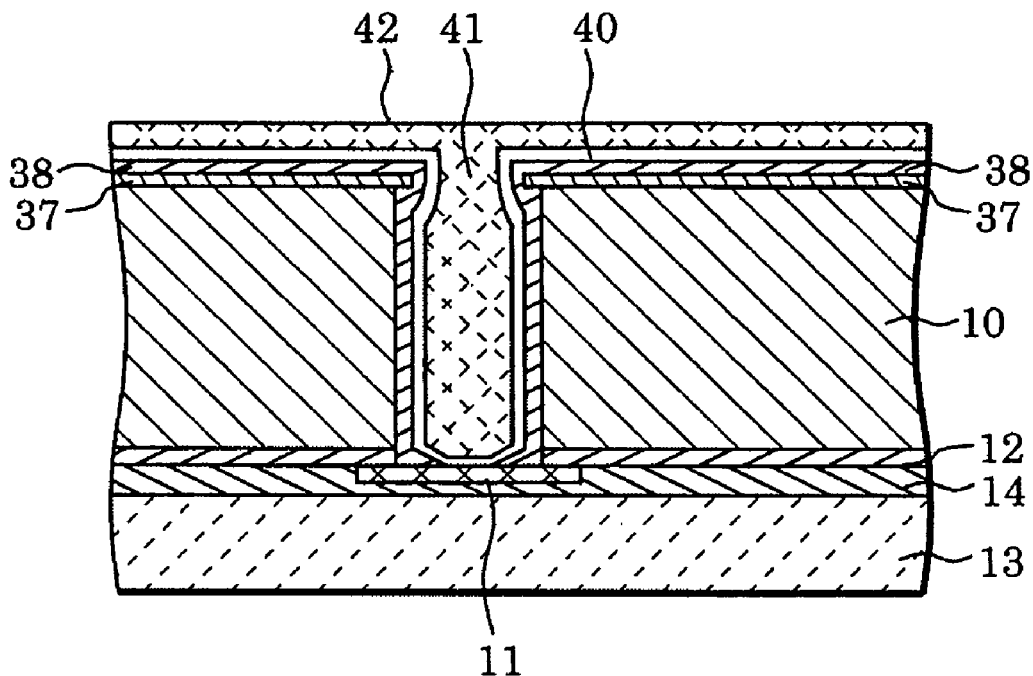
FIG. 14 is a cross-sectional view showing the manufacturing method of the semiconductor device according to the second embodiment of this invention.

Next, a barrier/seed layer 40 is formed on the insulation film 38 on the back surface of the semiconductor substrate 10 and on the surface of the via hole 16, as shown in FIG. 14. The barrier/seed layer 40 is made of the same metal layers as the barrier/seed layer 20 in the first embodiment, and is formed by the same method as the barrier/seed layer 20.

Next, a through-hole electrode 41 made of copper (Cu), for example, and a wiring layer 42, that is continuous to the through-hole electrode 41, are formed on the barrier/seed layer 40, including inside of the via hole 16, by electrolytic plating, for example. That is, the through-hole electrode 41 and the wiring layer 42 are made of the same metal as the through-hole electrode 21 and the wiring layer 22 in the first embodiment, and are formed by the same method as the through-hole electrode 21 and the wiring layer 22. The through-hole electrode 41 and the wiring layer 42 are electrically connected to the pad electrode 11 exposed at the bottom of the via hole 16 through the barrier/seed layer 40. Since the side wall of the via hole 16 is covered with the insulation film 38, the insulation failure between the through-hole electrode in the via hole and the semiconductor substrate observed with the device of FIG. 25 is prevented.

Figure 15:
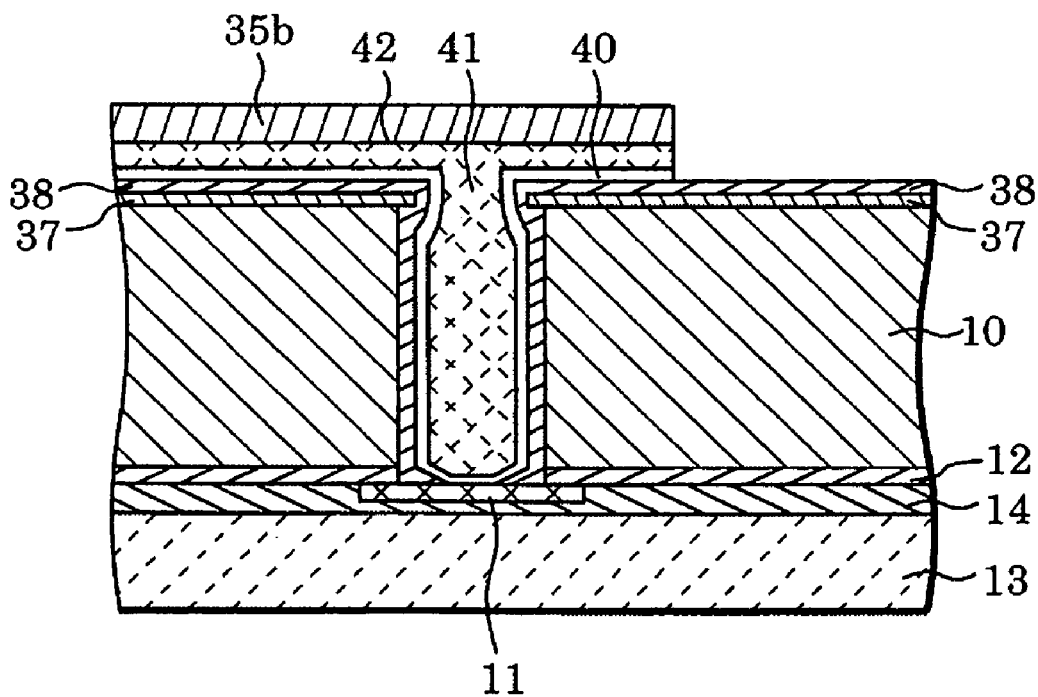
FIG. 15 is a cross-sectional view showing the manufacturing method of the semiconductor device according to the second embodiment of this invention.

Next, a second photoresist layer 35b, that is used to shape the wiring layer 42 into a predetermined pattern, is formed selectively on the wiring layer 42 on the back surface of the semiconductor substrate 10, as shown in FIG. 15. The second photoresist layer 35b is formed on a region of the wiring layer 42 that is to remain corresponding to the predetermined pattern. The region of the wiring layer 42 that is to remain includes a location of the via hole 16 at least.

Next, unnecessary portion of the wiring layer 42 and the barrier/seed layer 40 are removed by etching using the second photoresist layer 35b as a mask. Or, at least the unnecessary portion of the wiring layer 42 is removed by etching. The wiring layer 42 is shaped into the predetermined pattern of wiring by the etching.

Figure 16:
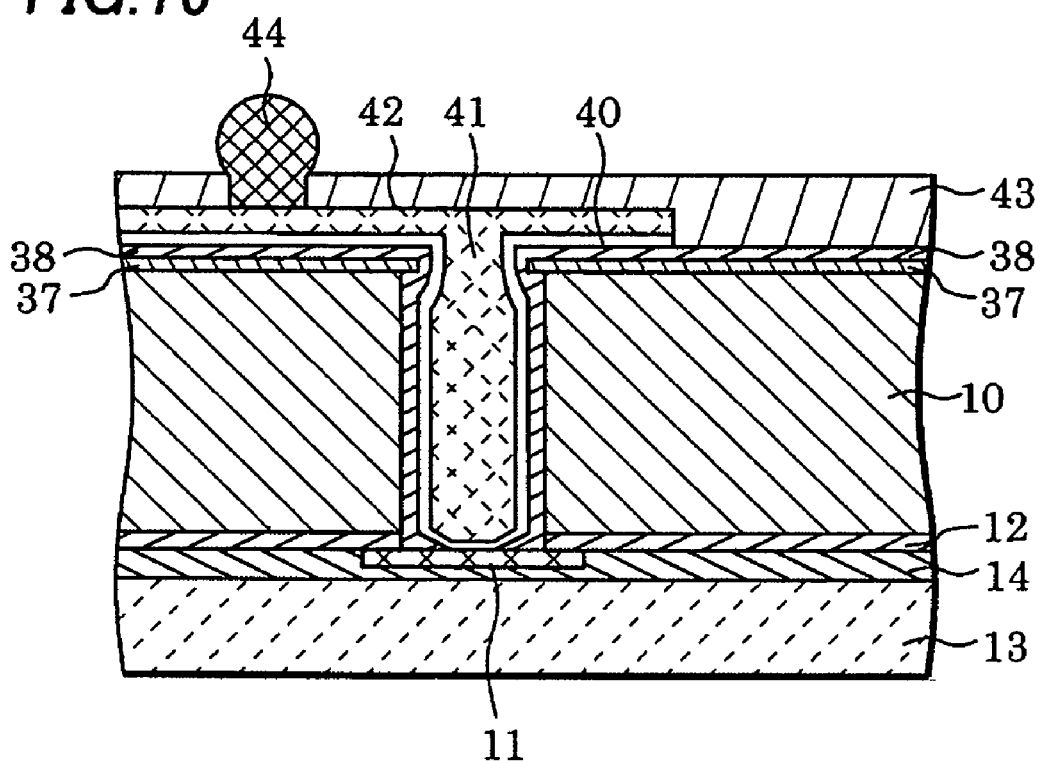
FIG. 16 is a cross-sectional view showing the manufacturing method of the semiconductor device according to the second embodiment of this invention.

Next, after the second photoresist layer 35b is removed, a protection layer 43 made of the same material as the protection layer 23 in the first embodiment is formed to cover the back surface of the semiconductor substrate 10, as shown in FIG. 16. An opening is formed in the protection layer 43 at a location on the wiring layer 42. And a conductive terminal 44 similar to the conductive terminal 24 in the first embodiment is formed on the wiring layer 42 exposed in the opening.

Figure 17:
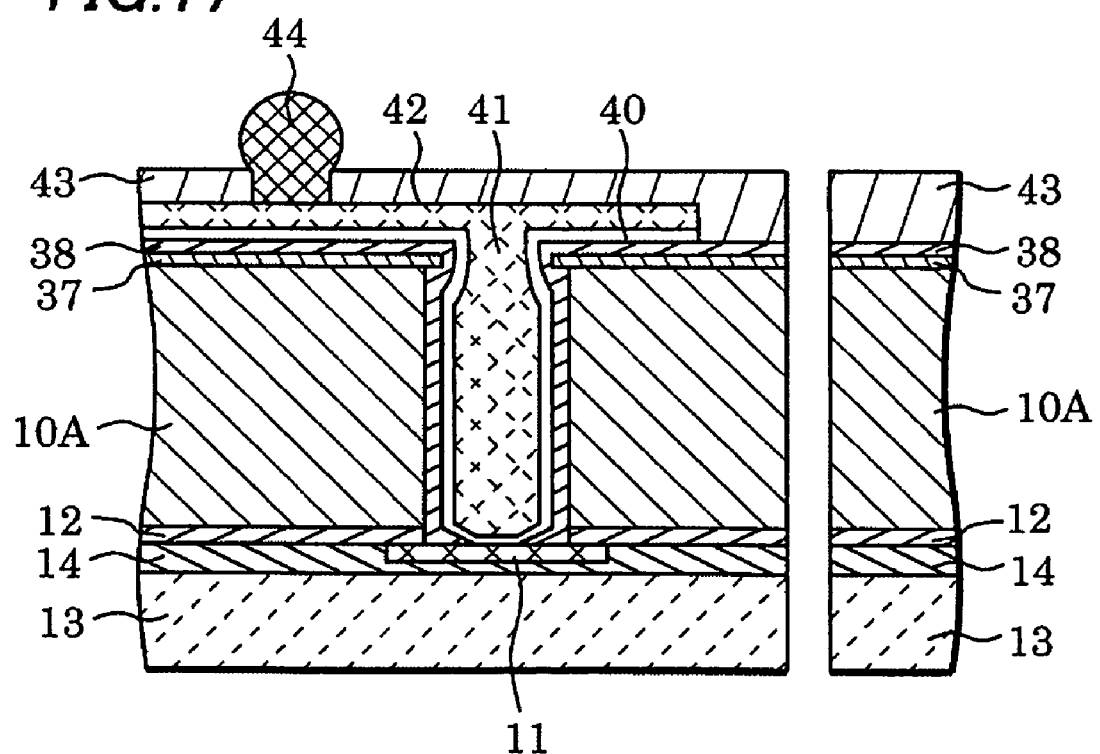
FIG. 17 is a cross-sectional view showing the manufacturing method of the semiconductor device according to the second embodiment of this invention.

Next, the semiconductor substrate 10 and the stacked layers on it are diced and separated along a dicing line (not shown), as shown in FIG. 17. With this, a plurality of semiconductor devices composed of semiconductor dice 10A and the stacked layers is completed.

In the manufacturing method according to the second embodiment, as described above, the overhung portion 38a of the insulation film 38 formed on the hard mask 37 suppresses the flow of etching gas reaching the side wall of the via hole 16 when the insulation film 38 (and the interlayer insulation film 12, if it remains) on the bottom of the via hole 16 is etched. Consequently, the etched-off region of the insulation film 38 on the bottom of the via hole 16 can be kept from extending to the side wall of the via hole 16. And the reduction in the thickness of the insulation film 38 on the side wall of the via hole 16 by the etching is suppressed as much as possible. That is, it is made possible that the pad electrode 11 is exposed while insulation is maintained between the through-hole electrode 41 in the via hole 16 and the semiconductor substrate 10.

Therefore, the conventional insulation failure between the through-hole electrode and the semiconductor die can be prevented. As a result, in the manufacturing method of the semiconductor device having the through-hole electrode, the reliability and yield of the semiconductor device can be improved.

Next, a manufacturing method of a semiconductor device according to a third embodiment of this invention will be explained hereinafter, referring to the drawings. FIGS. 18–23 are cross-sectional views showing the manufacturing method of the semiconductor device according to the third embodiment. The same reference numerals are used for the common components in FIGS. 18–23 as in FIGS. 1–9 referred in the explanation of the first embodiment.

Figure 18:
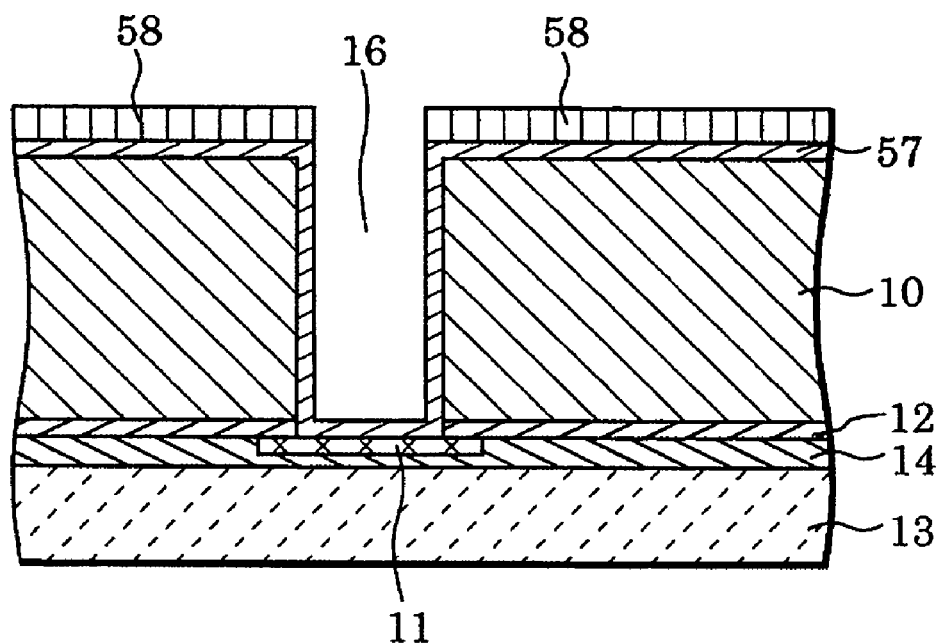
FIG. 18 is a cross-sectional view showing a manufacturing method of a semiconductor device according to a third embodiment of this invention.

First, as shown in FIG. 18, a via hole 16 penetrating through a semiconductor substrate 10 is formed as in the first embodiment. Then an interlayer insulation film 12 exposed at a bottom of the vie hole 16 is etched to reduce its thickness or remove it completely by dry etching or wet etching. Or, the etching of the interlayer insulation film 12 may not be performed at this stage of the manufacturing process and may be performed in a later process step of etching to be described later.

Next, an insulation film 57, that is a second insulation film, is formed on a back surface of the semiconductor substrate 10 and on a surface of the via hole 16. The insulation film 57 is made of a silicon dioxide (SiO2) film or a silicon nitride (SiN) film, for example, as in the first embodiment, and is formed by plasma CVD, for example.

Next, a metal layer 58 is selectively formed on the insulation film 57 on the back surface of the semiconductor substrate 10. That is, the metal layer 58 is formed to have an opening corresponding to an opening of the via hole 16 on the back surface of the semiconductor substrate 10. Although not shown in the figure, the metal layer 58 may be formed to have an overhung portion protruding at a rim of the via hole 16 toward inside of the via hole 16.

The metal layer 58 is made of a metal such as aluminum (Al), for example. The metal layer 58 may be made of other metal such as titanium (Ti) or tungsten (W), or an alloy of those metals. The metal layer 58 is formed by sputtering, for example, or by other method.

When the metal layer 58 is formed by sputtering, the sputtering can be a low bias voltage sputtering that is commonly used in a manufacturing process of a semiconductor device. With the low bias voltage sputtering, the metal layer 58 is formed only on the insulation film 57 and not on the surface of the via hole 16 because of the low bias voltage. A process to form the metal layer 58 by the sputtering costs less than a process to form the reinforcing insulation film 18 in the first embodiment and a process to form the hard mask 37 in the second embodiment.

Figure 19:
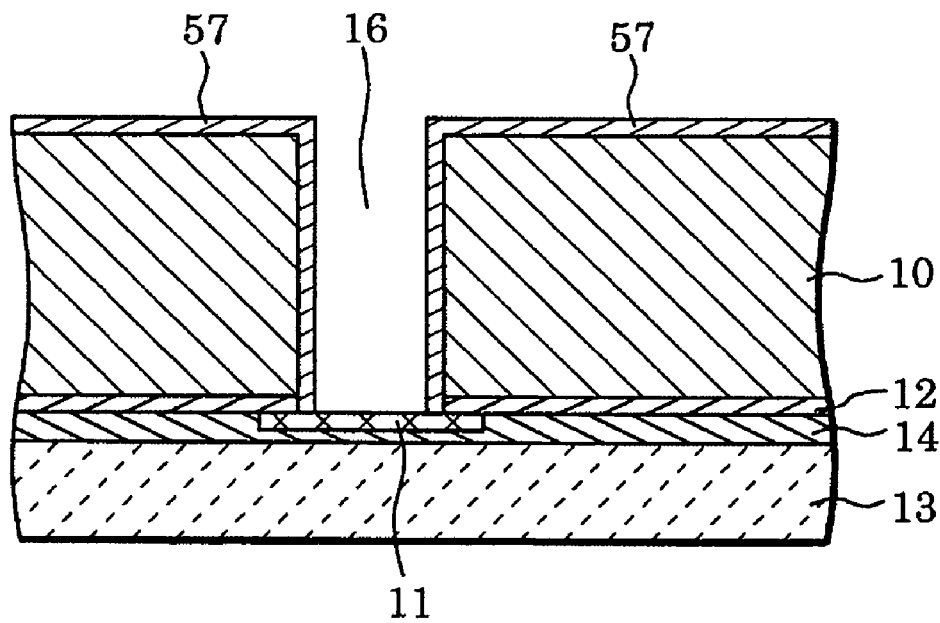
FIG. 19 is a cross-sectional view showing the manufacturing method of the semiconductor device according to the third embodiment of this invention.

Next, the insulation film 57 (and the interlayer insulation film 12, if it remains) at the bottom of the via hole 16 is removed by etching using the metal layer 58 as a mask, as shown in FIG. 19. Although the etching is preferably reactive ion etching, it may be other etching method.

In the etching described above, the metal layer 58 around the opening of the via hole 16 suppresses a flow of etching gas reaching a side wall of the via hole 16 as much as possible. With this, the reduction in the thickness of the insulation film 57 on the side wall of the via hole 16 by the etching can be suppressed. It should be noted that etched-off region of the insulation film 57 (or the insulation film 57 and-the interlayer insulation film 12) at the bottom of the via hole 16 tends to reach closer to the side wall of the via hole 16 compared with the first and the second embodiments when the metal layer 58 is formed to have no overhung portion (not shown) at the rim of the via hole 16. When the metal layer 58 is formed to have the overhung portion described above, it can be prevented that the etched-off region of the insulation film 57 tends to reach close to the side wall of the via hole 16, since the overhung portion suppresses the flow of etching gas reaching the bottom of the via hole 16.

By the etching described above, therefore, the insulation film 57 at the bottom of the via hole 16 can be removed to expose the pad electrode 11 while the insulation film 57 formed on the side wall of the via hole 16 remains.

The metal layer 58 is removed after the etching. The metal layer 58 is removed by wet etching, for example, or by other method.

Figure 20:
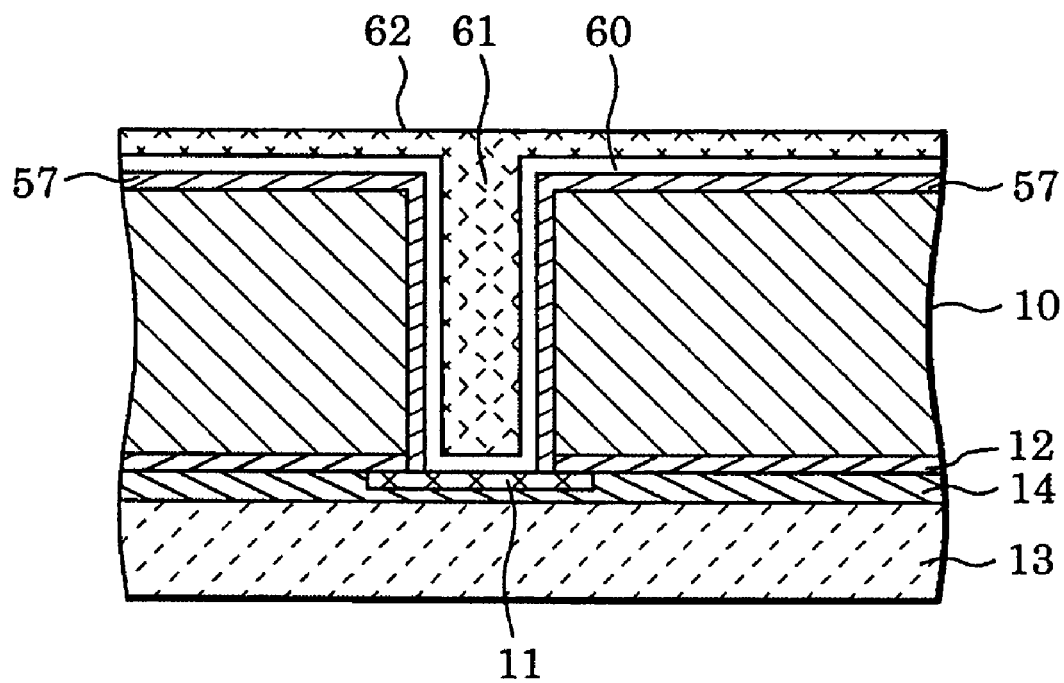
FIG. 20 is a cross-sectional view showing the manufacturing method of the semiconductor device according to the third embodiment of this invention.

Next, a barrier/seed layer 60 is formed on the insulation film 57 on the back surface of the semiconductor substrate 10 and on the surface of the via hole 16, as shown in FIG. 20. The barrier/seed layer 60 is made of the same metal layers as the barrier/seed layer 20 in the first embodiment, and is formed by the same method as the barrier/seed layer 20.

Next, a through-hole electrode 61 made of copper (Cu), for example, and a wiring layer 62, that is continuous to the through-hole electrode 61, are formed on the barrier/seed layer 60, including inside of the via hole 16, by electrolytic plating, for example. That is, the through-hole electrode 61 and the wiring layer 62 are made of the same metal as the through-hole electrode 21 and the wiring layer 22 in the first embodiment, and are formed by the same method as the through-hole electrode 21 and the wiring layer 22. The through-hole electrode 61 is electrically connected with the pad electrode 11 exposed at the bottom of the via hole 16 through the barrier/seed layer 60. Since the side wall of the via hole 16 is covered with the insulation film 57, the conventional insulation failure between the through-hole electrode in the via hole and the semiconductor substrate is prevented.

Figure 21:
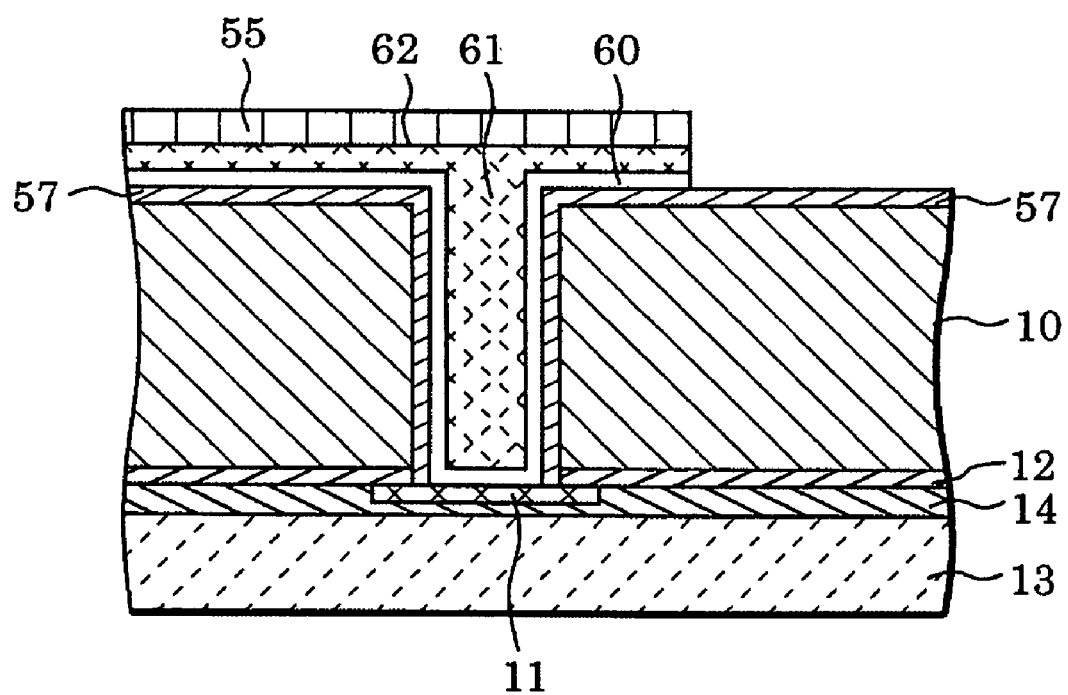
FIG. 21 is a cross-sectional view showing the manufacturing method of the semiconductor device according to the third embodiment of this invention.

Next, a photoresist layer 55, that is used to shape the wiring layer 62 into a predetermined pattern, is formed selectively on the wiring layer 62 on the back surface of the semiconductor substrate 10, as shown in FIG. 21. The photoresist layer 55 is formed on a region of the wiring layer 62 that is to remain corresponding to the predetermined pattern. The region of the wiring layer 62 that is to remain includes a location of the via hole 16 at least.

Next, unnecessary portion of the wiring layer 62 and the barrier/seed layer 60 are removed by etching using the photoresist layer 55 as a mask. Or, at least the unnecessary portion of the wiring layer 62 is removed by etching. The wiring layer 62 is shaped into the predetermined pattern of wiring by the etching.

Figure 22:
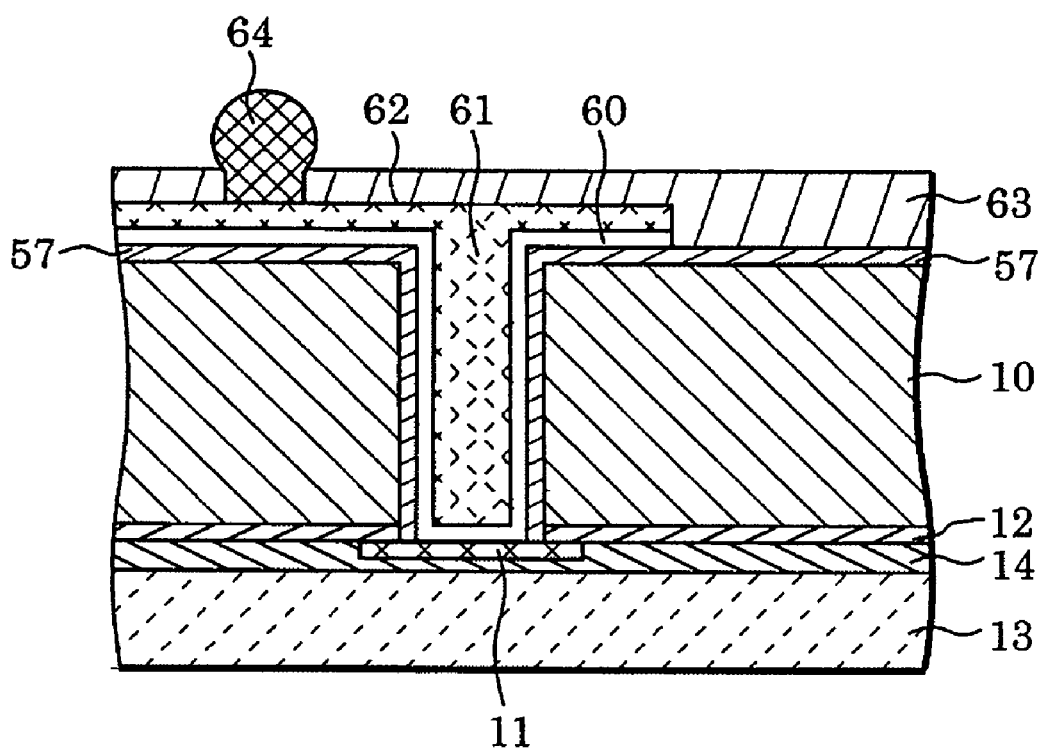
FIG. 22 is a cross-sectional view showing the manufacturing method of the semiconductor device according to the third embodiment of this invention.

Next, after the photoresist layer 55 is removed, a protection layer 63 made of the same material as the protection layer 23 in the first embodiment is formed to cover the back surface of the semiconductor substrate 10, as shown in FIG. 22. An opening is formed in the protection layer 63 at a location on the wiring layer 62. And a conductive terminal 64 similar to the conductive terminal 24 in the first embodiment is formed on the wiring layer 62 exposed in the opening.

Figure 23:
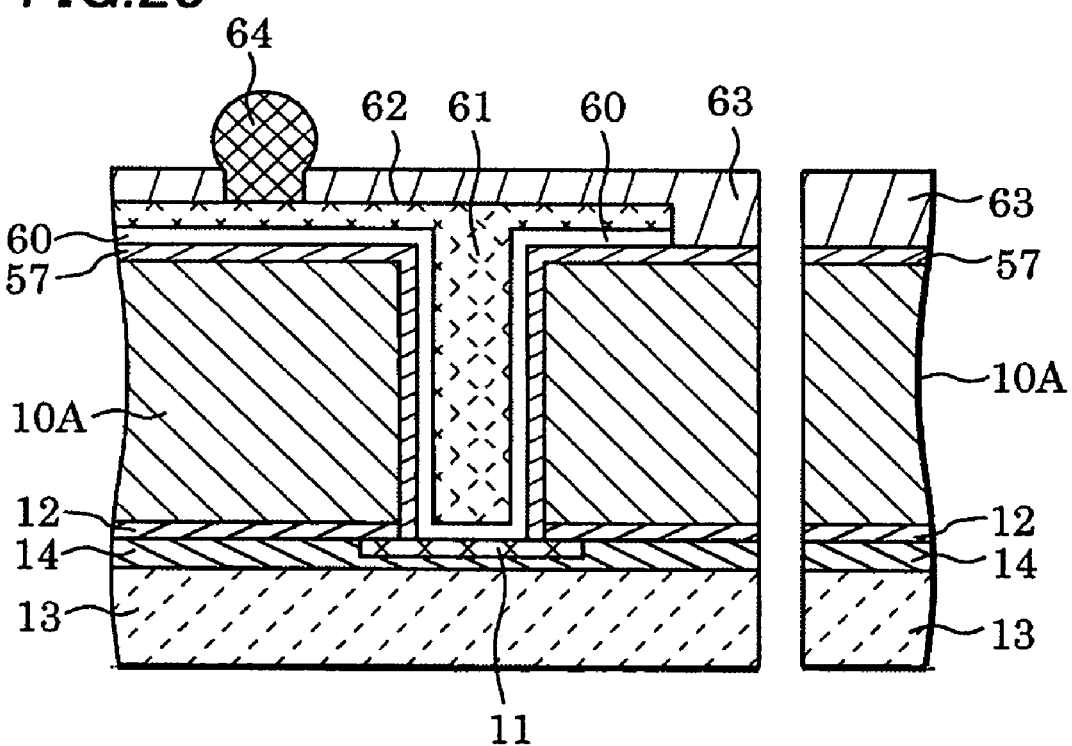
FIG. 23 is a cross-sectional view showing the manufacturing method of the semiconductor device according to the third embodiment of this invention.
Figure 24:
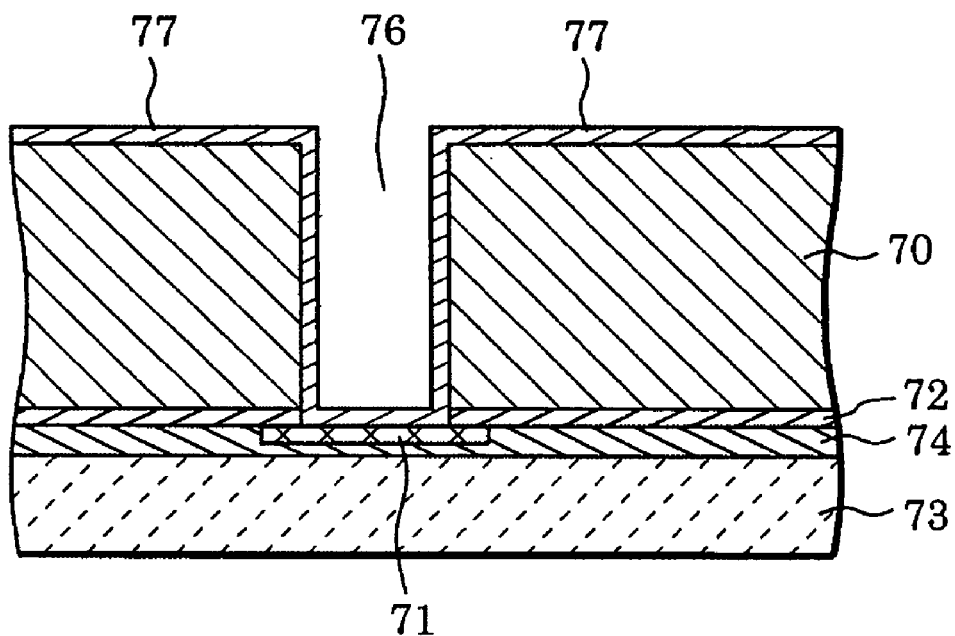
FIG. 24 is a cross-sectional view showing a manufacturing method of a semiconductor device according to a conventional art.

Next, the semiconductor substrate 10 and the stacked layers on it are diced and separated along a dicing line (not shown), as shown in FIG. 23. With this, a plurality of semiconductor devices composed of semiconductor dice 10A and the stacked layers is completed.

In the manufacturing method according to the third embodiment, as described above, the metal layer 58 around the opening of the via hole 16 suppresses the flow of etching gas reaching the side wall of the via hole 16 when the insulation film 57 (and the interlayer insulation film 12, if it remains) at the bottom of the via hole 16 is etched. With this, the reduction in the thickness of the insulation film 57 on the side wall of the via hole 16 by the etching is suppressed as much as possible. Therefore, the conventional insulation failure between the through-hole electrode and the semiconductor die can be prevented. As a result, in the manufacturing method of the semiconductor device having the through-hole electrode, the reliability and yield of the semiconductor device can be improved.

Each of the through-hole electrodes 21, 41 and 61 described in each of the first, second and third embodiments, respectively, is not limited to be formed in the process described above, and may be formed in other process. For example, the through-hole electrode 21, 41 or 61 and the wiring layer 22, 42 or 62 may be formed by plating using a photoresist layer (not shown) for pattering the wiring layer 22, 42 or 62 formed on a region of the barrier/seed layer 20, 40 or 60 where the wiring layer 22, 42 or 62 is not formed.

Also, the through-hole electrode 21, 41 or 61 and the wiring layer 22, 42 or 62 may be made of metal other than copper (Cu) by a method other than plating. For example, the through-hole electrode 21, 41 or 61 and the wiring layer 22, 42 or 62 may be formed by CVD. Or, the through-hole electrode 21, 41 or 61 and the wiring layer 22, 42 or 62 may be formed by tin (Sn) plating followed by copper (Cu) plating. Or, the through-hole electrode 21, 41 or 61 and the wiring layer 22, 42 or 62 may be made of aluminum (Al) or aluminum alloy and may be formed by sputtering, for example. Also, the through-hole electrode 21, 41 or 61 and the wiring layer 22, 42 or 62 may be formed in separate process steps.

And each of the first, second and third embodiments does not necessarily include forming the wiring layer 22, 42 or 62, or forming the conductive terminal 24, 44 or 64. That is, the wiring layer 22, 42 or 62, or the conductive terminal 24, 44 or 64 is not necessarily formed, as long as the through-hole electrode 21, 41 or 61 exposed in the opening of the via hole 16 can be electrically connected to a circuit board (not shown). For example, the through-hole electrode 21, 41 or 61 exposed in the opening of the via hole 16 may be connected to the circuit board (not shown) without passing through the wiring layer 22, 42 or 62 or the conductive terminal 24, 44 or 64. Or, the through-hole electrode 21, 41 or 61 may be connected to the circuit board (not shown) through the conductive terminal 24,44 or 64 formed on the through-hole electrode exposed in the opening of the via hole 16 without passing through the wiring layer 22, 42 or 62.

According to this invention, the insulation film formed on the back surface of the semiconductor substrate and having the overhung portion at the rim of the via hole is used as a mask when the insulation film on the bottom of the via hole is etched to expose the pad electrode. Or, the metal layer formed on a part of the back surface of the semiconductor substrate excluding the opening of the via hole is used as a mask.

This etching makes it possible that only the insulation film on the bottom of the via hole is removed to expose the pad electrode. Therefore, the insulation failure between the through-hole electrode and the semiconductor substrate observed with the conventional device of FIG. 25 can be prevented. As a result, in the manufacturing method of the semiconductor device having the through-hole electrode, the reliability and yield of the semiconductor device can be improved.

What is claimed is:

1. A method of manufacturing a semiconductor device, comprising:
  providing a semiconductor substrate comprising a first insulation film formed on a top surface thereof and a pad electrode formed on the first insulation film;
  forming from a bottom surface of the semiconductor substrate a via hole penetrating through the semiconductor substrate to expose part of the first insulation film that covers the pad electrode;
  removing the exposed part of the first insulation film;
  forming a second insulation film on the bottom surface of the semiconductor substrate and inside the via hole;
  forming a third insulation film on the second insulation film so that the third insulation film comprises an overhung portion extending from a rim of the via hole toward an inside of the via hole;
  etching the second insulation film using the third insulation film as a mask to expose the pad electrode at a bottom of the via hole;
  forming in the via hole a through-hole electrode that is electrically connected with the pad electrode; and
  cutting the semiconductor substrate to produce a semiconductor die.

2. The method of claim 1, further comprising forming a wiring layer on the bottom surface of the semiconductor substrate so that the wiring layer is connected with the through-hole electrode.

3. The method of claim 2, further comprising forming a conductive terminal on the wiring layer.

4. The method of claim 1, wherein the third insulation film is formed by chemical vapor deposition under non-conformal conditions.

5. The method of claim 4, further comprising forming a wiring layer on the bottom surface of the semiconductor substrate so that the wiring layer is connected with the through-hole electrode.

6. The method of claim 5, further comprising forming a conductive terminal on the wiring layer.

7. A method of manufacturing a semiconductor device, comprising:
  providing a semiconductor substrate comprising a first insulation film formed on a top surface thereof and a pad electrode formed on the first insulation film;
  forming on a bottom surface of the semiconductor substrate a hard mask having an opening corresponding to the pad electrode on the top surface;
  forming using the hard mask as an etching mask a via hole that has an undercut around the opening so that a lateral size of the via hole is larger than the opening of the hard mask, part of the first insulation film that covers the pad electrode is exposed in the via hole;
  removing the exposed part of the first insulation film;
  forming a second insulation film on the hard mask and inside the via hole so that the second insulation film comprises an overhung portion extending from a rim of the via hole toward an inside of the via hole;
  etching the second insulation film using the overhanging portion of the second insulation film as a mask to expose the pad electrode at a bottom of the via hole;
  forming in the via hole a through-hole electrode that is electrically connected with the pad electrode; and
  cutting the semiconductor substrate to produce a semiconductor die.

8. The method of claim 7, further comprising forming a wiring layer on the bottom surface of the semiconductor substrate so that the wiring layer is connected with the through-hole electrode.

9. The method of claim 8, further comprising forming a conductive terminal on the wiring layer.

10. A method of manufacturing a semiconductor device, comprising:
  providing a semiconductor substrate comprising a first insulation film formed on a top surface thereof and a pad electrode formed on the first insulation film;
  forming from a bottom surface of the semiconductor substrate a via hole penetrating through the semiconductor substrate to expose part of the first insulation film that covers the pad electrode;
  removing the exposed part of the first insulation film;
  forming a second insulation film on the bottom surface of the semiconductor substrate and inside the via hole;
  forming a metal mask made of a metal on the second insulation film so that an opening of the metal mask corresponds to the via hole;
  etching the second insulation film using the metal mask to expose the pad electrode at a bottom of the via hole;
  removing the metal mask;
  forming in the via hole a through-hole electrode that is electrically connected with the pad electrode; and
  cutting the semiconductor substrate to produce a semiconductor die.

11. The method of claim 10, further comprising forming a wiring layer on the bottom surface of the semiconductor substrate so that the wiring layer is connected with the through-hole electrode.

12. The method of claim 11, further comprising forming a conductive terminal on the wiring layer.

* * * * *